(12) United States Patent
Clendenning et al.

(10) Patent No.: US 8,659,058 B2
(45) Date of Patent: Feb. 25, 2014

(54) METHODS OF FORMING NICKEL SULPHIDE FILM ON A SEMICONDUCTOR DEVICE

(75) Inventors: Scott B. Clendenning, Portland, OR (US); Niloy Mukherjee, Beaverton, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 228 days.

(21) Appl. No.: 13/051,745

(22) Filed: Mar. 18, 2011

(65) Prior Publication Data

US 2011/0169059 A1    Jul. 14, 2011

Related U.S. Application Data

(62) Division of application No. 12/347,763, filed on Dec. 31, 2008, now Pat. No. 7,964,490.

(51) Int. Cl.
   *H01L 29/772*    (2006.01)

(52) U.S. Cl.
   USPC ........................................................ 257/288

(58) Field of Classification Search
   USPC .......... 257/213, 327, 328, E29.242, E29.255, 257/E29.262, E29.117, E29.273, E21.411, 257/E21.413, E21.414, E51.005–E51.007, 257/288, E29.116, E21.409; 438/672, 680, 438/597
   See application file for complete search history.

(56) References Cited

U.S. PATENT DOCUMENTS

| | | | |
|---|---|---|---|
| 4,513,057 A | 4/1985 | Peters | |
| 4,814,259 A | 3/1989 | Newman et al. | |
| 5,041,306 A | 8/1991 | Warren | |
| 5,144,410 A | 9/1992 | Johnson | |
| 5,268,024 A | 12/1993 | Moran | |
| 5,422,500 A * | 6/1995 | Tomikawa et al. | 257/76 |
| 5,804,473 A * | 9/1998 | Takizawa | 438/166 |
| 6,140,703 A * | 10/2000 | Cronin et al. | 257/766 |
| 7,964,490 B2 | 6/2011 | Clendenning et al. | |
| 2005/0023367 A1 | 2/2005 | Reighard et al. | |
| 2005/0057136 A1* | 3/2005 | Moriya et al. | 313/311 |
| 2005/0116225 A1* | 6/2005 | Yamazaki et al. | 257/58 |
| 2006/0009021 A1* | 1/2006 | Herman et al. | 438/607 |
| 2006/0249849 A1 | 11/2006 | Cohen | |
| 2007/0020400 A1 | 1/2007 | Chang | |
| 2008/0296569 A1* | 12/2008 | Ho et al. | 257/43 |
| 2010/0024847 A1 | 2/2010 | Breese et al. | |
| 2010/0163937 A1 | 7/2010 | Clendenning et al. | |

FOREIGN PATENT DOCUMENTS

WO    03063216 A1    7/2003

OTHER PUBLICATIONS

Oshima et al., "Self-aligned NiSi2 Electrode Fabrication by MBE and its Application to Etched-Groove Permeable Base Transistor (PBT)", J. of Crystal Growth, 95 (1989): pp. 490-493.*

Townsend et al., "Metal-semiconductor transition in single crystal hexagonal nickel sulphide", J. Phys. C: Solid St. Phys. (1971): pp. 598-606.*

(Continued)

*Primary Examiner* — Michele Fan
(74) *Attorney, Agent, or Firm* — Winkle, PLLC (57) ABSTRACT

Embodiments of the present invention describe a method of forming nickel sulfide layer on a semiconductor device. A nickel sulfide layer is formed on a substrate by alternatingly exposing the substrate to a nickel-containing precursor and a sulfur-containing precursor.

3 Claims, 9 Drawing Sheets

(56) References Cited

OTHER PUBLICATIONS

Aderhold et al., "GOI Impact of Cu, Ni and Al on the Wafer Surface Prior to RTP and Furnace Oxidations", Mat. Res. Soc. Symp. Proc. vol. 429 (1996): pp. 275-280.*

Kassim, et al., "Preparation and Studies of Nickel Sulfide Thin Films in the Presence of Sodium Tartrate as a Complexing Agent", Materials Science, vol. 10, No. 2, 2004, pp. 157-161.

O'Brien, et al., "A single source approach to deposition of nickel sulfide thin films by LP-MOCVD", Thin Solid Films, May 1, 2003, pp. 502-505.

O'Brien, et al., "Deposition of Ni and Pd Sulfide Thin Films via Aerosol-Assisted CVD", Chemical Vapor Deposition, Oct. 2006, pp. 620-626.

Gordon, "Atomic Layer Deposition (ALD) : An Enabler for Nanoscience and Nanotechnology", Harvard University Center for Nanoscale Systems, Jul. 29, 2008.

* cited by examiner

METHODS OF FORMING NICKEL SULPHIDE FILM ON A SEMICONDUCTOR DEVICE

CROSS REFERENCE TO RELATED APPLICATION

This application is a divisional application of U.S. patent application Ser. No. 12/347,763 filed Dec. 31, 2008.

BACKGROUND OF THE INVENTION

1. Field of the Invention

The present invention relates to the field of semiconductor processing and more particularly to methods of forming of nickel sulfide film on semiconductor devices.

2. Discussion of Related Art

Low resistance contact layers are commonly formed on source/drain regions of transistors to improve performance, such as lowering the parasitic resistance. An example of a low resistance contact layer is the self-aligned silicide layer, commonly referred to as salicide. Current metal deposition for salicide formation is accomplished by physical vapor deposition (PVD). However, the directional nature of the depositing flux in the PVD technique has certain drawbacks, such as difficulty in depositing metal at the bottom of high aspect ratio features and non-conformal metal deposition on three-dimensional (3D) features of 3D transistor structures.

Figures 1, 2A, 7:
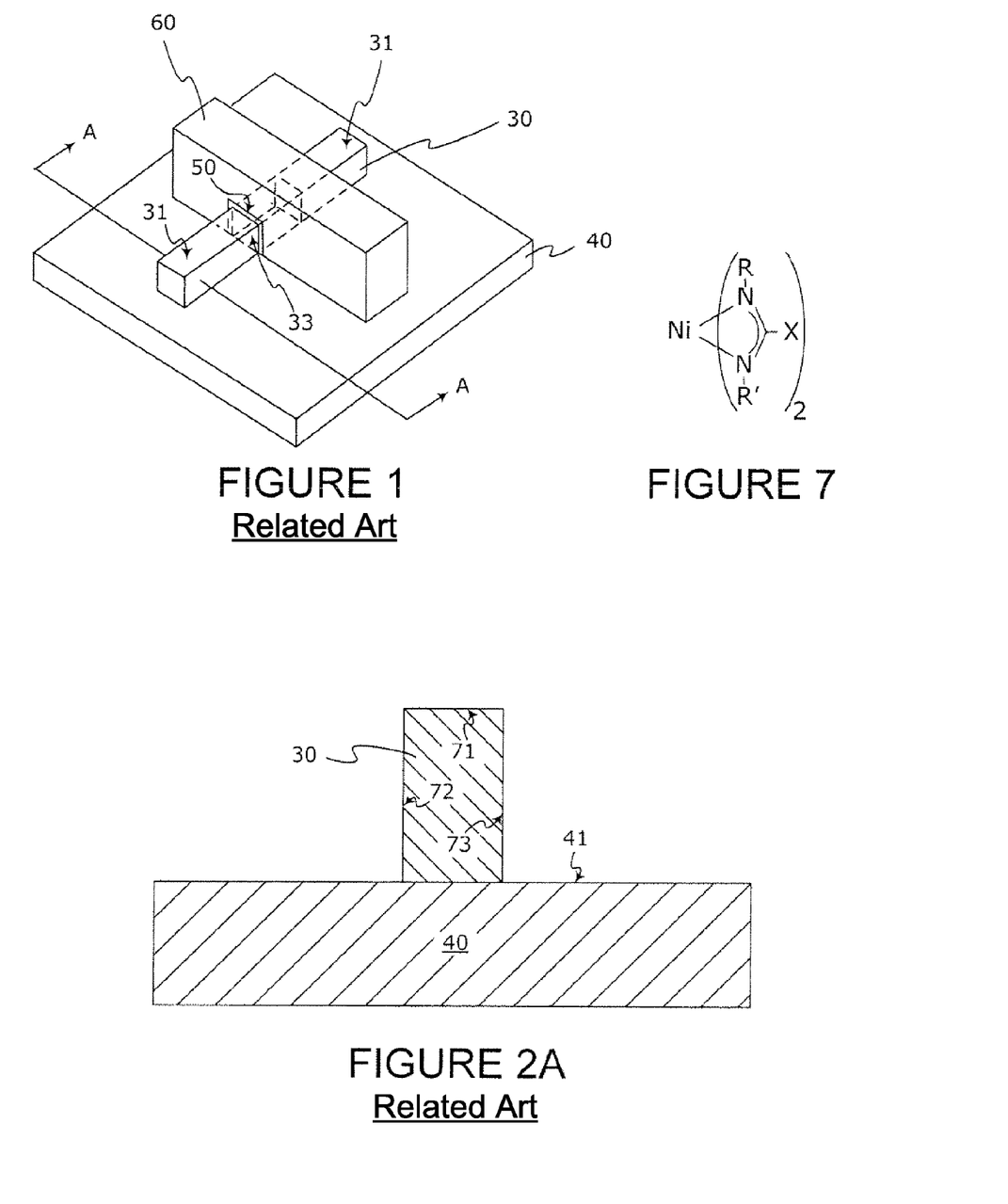
FIG. 1 is a three-dimensional view that illustrates a tri-gate transistor.
FIGS. 2A-2C are cross-sectional views that illustrate a method of forming a metal contact layer on the source/drain region of a tri-gate transistor using conventional physical vapor deposition.
FIG. 7 illustrate the chemical structure of the nickel-containing precursor in accordance with one embodiment of the present invention.

FIG. 1 illustrates an example of a 3D transistor structure known as the tri-gate transistor. The tri-gate transistor comprises a semiconductor body 30 having a fin shape formed on a substrate 40. Source/drain regions 31 are formed adjacent to opposite ends of the semiconductor body 30. A gate dielectric 50 is formed conformally onto the channel region 33, wherein channel region 33 refers to the portion between the source and drain regions 31. A gate electrode 60 is formed on the gate dielectric 50. The semiconductor body 30 can be doped to form source/drain regions 31. During doping of source/drain regions, the gate electrode 60 acts as a mask to prevent the channel region 33 from being doped.

FIG. 2A shows the cross-sectional view of the semiconductor body 30 across line A-A in FIG. 1, which also represents the source/drain region 31. Semiconductor body 30 is a fin-shaped or ridge-shaped structure comprising a top surface 71, a first sidewall 72 and a second sidewall 73, wherein the first and second sidewalls 72, 73 extend from opposite sides of the top surface 71 of source/drain region 31 to the top surface 41 of the substrate 40.

Figure 2B:
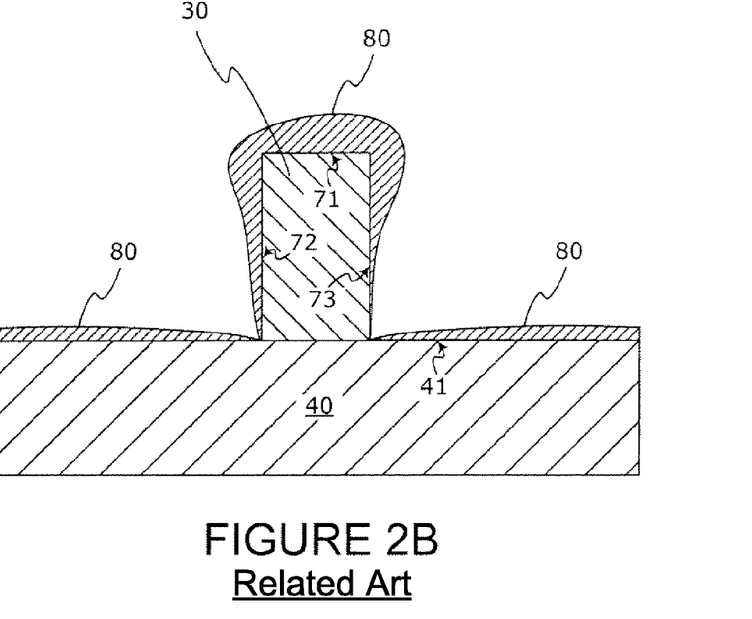
Figure 2C:
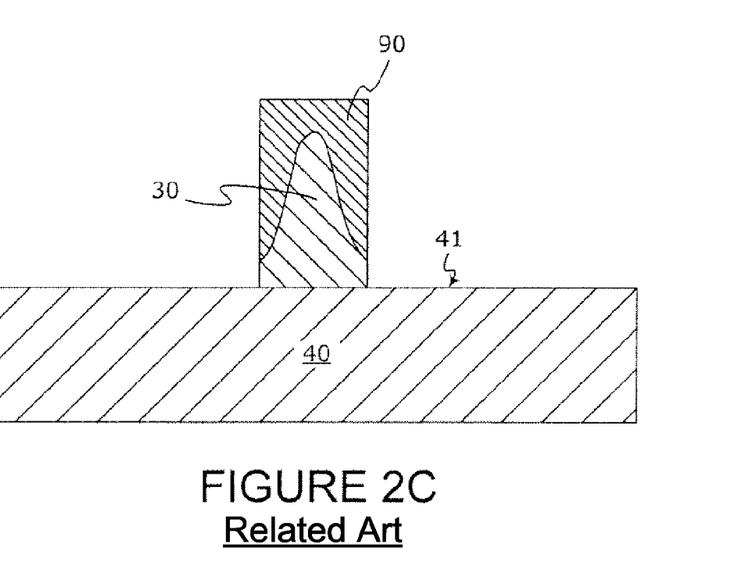

Typically, a PVD metal deposition is used to form contact layers on the tri-gate transistor. FIG. 2B illustrates a metal contact layer 80 formed on the semiconductor body 30 as well as the top surface of the substrate 40 by using a conventional PVD metal deposition. However, due to the directional nature of the depositing flux, the metal contact layer 80 is not formed conformally on the top surface 71 and sidewalls 72, 73. Next, in FIG. 2C, an annealing process following the PVD metal deposition usually results in non-uniform reaction between the metal contact layer 80 and the semiconductor body 30. The annealing process could cause excessive consumption 90 of the semiconductor body 30 by the metal contact layer 80.

DETAILED DESCRIPTION OF THE PRESENT INVENTION

In the following description, numerous specific details are set forth in order to provide a thorough understanding of the present invention. In other instances, well known semiconductor processing techniques and features have not been described in particular detail in order not to unnecessarily obscure the present invention.

Embodiments of the present invention describe a method of forming nickel sulfide layer on a semiconductor device. In an embodiment of the present invention, the semiconductor device comprises a substrate or a semiconductor body. A nickel sulfide layer is conformally deposited on the substrate or semiconductor body by alternatingly exposing the substrate or semiconductor body to a nickel-containing precursor and a sulfur-containing precursor. For example, the nickel containing precursor can be a nickel organometallic compound and the sulfur-containing precursor can be hydrogen sulfide. The nickel sulfide layer can be used for contact applications, contact metallizations, or a metal gate of a semiconductor device. In particular, the nickel sulfide layer can be conformally deposited onto 3D transistor structures or into high aspect ratio contact holes. The terms "conformal" and "conformally" are used in the description to describe a film or layer having uniform thickness on a substrate, and having the capability to follow the shape of the substrate and any features thereon.

Figure 3A:
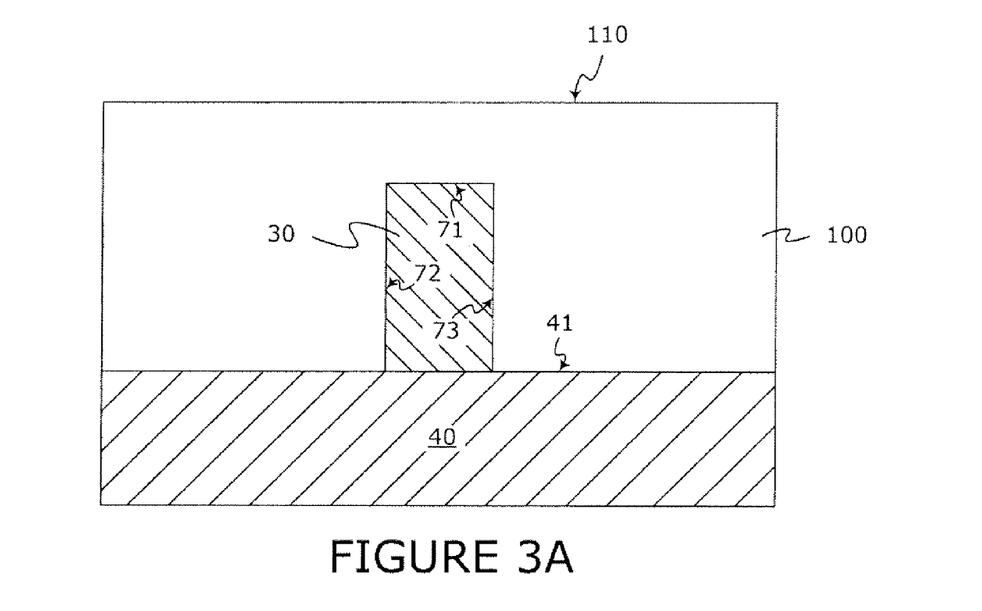
FIGS. 3A-3F are cross-sectional views that illustrate the method of forming a nickel sulfide layer on a semiconductor device in accordance with one embodiment of the present invention.

A method of forming a nickel sulfide layer on a semiconductor device is illustrated in FIGS. 3A-3F in accordance with one embodiment of the present invention. The semiconductor device comprises a substrate 40 having a semiconductor body 30 formed thereon, as shown in FIG. 3A. In an embodiment of the present invention, the semiconductor device can be a tri-gate transistor as described in FIG. 1. In this case, the semiconductor body 30 shown in FIG. 3A can either be the source or drain region 31 of the tri-gate transistor.

In one embodiment of the present invention, the substrate 40 is made of a semiconductor material such as but not limited to silicon (Si), silicon germanium (SiGe), germanium (Ge), and III-V compound semiconductors. Substrate 40 can be monocrystalline or polycrystalline. In one embodiment, substrate 40 is a semiconductor heterostructure such as but not limited to a silicon-on-insulator (SOI) substrate, or a multi-layered substrate comprising silicon, silicon germanium, germanium, III-V compound semiconductors, and any combinations thereof. Furthermore, the multi-layered substrate also includes insulator-semiconductor stacks, such as but not limited to silicon dioxide on silicon, or metal-oxide on silicon.

Semiconductor body 30 is a fin-shaped or ridge-shape structure comprising a top surface 71, a first sidewall 72 and a second sidewall 73. The first sidewall 72 and the second sidewall 73 extend from opposite sides of the top surface 71 to the top surface 41 of substrate 40. In one embodiment, semiconductor body 30 is made of a semiconductor material such as but not limited to silicon (Si), silicon germanium (SiGe), germanium (Ge), and Group III-V semiconductors. In one embodiment, the semiconductor body 30 and substrate 40 are made from a single semiconductor layer, such as Si, which is patterned or etched to form the semiconductor body 30 extending vertically from the top surface 41 of substrate 40. In another embodiment, the semiconductor body 30 and the substrate 40 are made from separate semiconductor layers. For example, the substrate 40 is the insulating-substrate of a SOI substrate, and the semiconductor body 30 is formed from the topmost silicon film of the SOI substrate.

Next, an interlayer dielectric 100 is deposited on the semiconductor body 30 and substrate 40 as shown in FIG. 3A. Interlayer dielectric 100 includes a top surface 110 formed above the top surface 41 of the semiconductor body 30. Interlayer dielectric 100 is made of any suitable and well known dielectric material, such as but not limited to silicon dioxide ($SiO_2$). In one embodiment, the interlayer dielectric 100 is made from a low-k material (k<3.6), such as but not limited to carbon doped oxide. Interlayer dielectric 100 can be deposited by well known techniques such as but not limited to chemical vapor deposition (CVD) and physical vapor deposition (PVD).

Figure 3B:
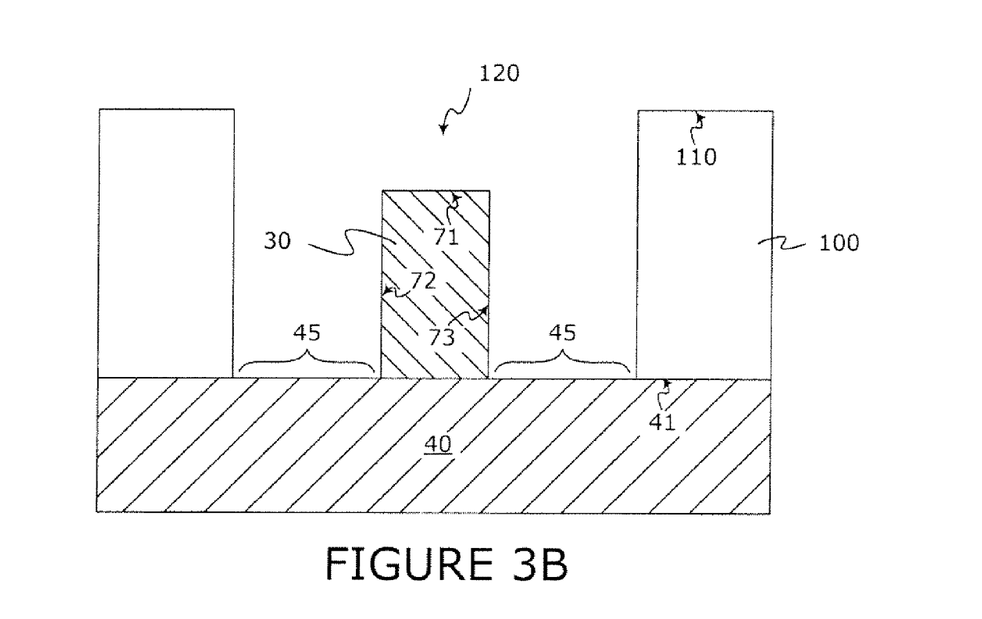

Next, in FIG. 3B, an opening 120 is formed in the interlayer dielectric 100 to expose the semiconductor body 30. In particular, the opening 120 exposes the top surface 71 and the first and second sidewalls 72, 73 of the semiconductor body 30. The opening 120 also exposes portions 45 of top surface 41 around the semiconductor body 30. Opening 120 can be formed by well known photolithography and etching techniques. In one embodiment, the etching process uses an etchant chemistry that selectively etches the interlayer dielectric 100 but does not etch the semiconductor body 30 and substrate 40. In one embodiment, the opening 120 does not expose the gate electrode 60, which is not shown in FIGS. 3A-3F for simplicity purposes.

In an embodiment of the present invention, the semiconductor body 30 is hydrogen-terminated (H-terminated) prior to forming the nickel sulfide layer. For example, the top surface 71 and the first and second sidewalls 72, 73 of the semiconductor body 30 can be chemically treated with hydrofluoric (HF) acid to form H-terminated surfaces. The H-termination treatment provides a clean, well-defined surface on the semiconductor body 30 that facilitates the formation of the nickel sulfide layer.

In one embodiment, the top surface 71 and the first and second sidewalls 72, 73 of the semiconductor body 30 can be treated with one or more nucleation promoting substances prior to forming the nickel sulfide layer. The nucleation promoting substances can be an organic substance, such as but not limited to self-assembled monolayers of substituted aryl groups (e.g. aminophenyl, bromophenyl, phenoxy), and alkyl chains terminated with functional groups such as amino, imino, hydroxyl, carboxylic acid, cyanate, isocyanate, halogen, thiol, vinyl or alkenyl groups. Furthermore, the nucleation promoting substance can also be an inorganic substance, such as but not limited to ammonium sulfide $(NH_4)_2S$, ammonium hydroxide ($NH_4OH$), tetramethylammonium hydroxide [$(CH_3)_4NOH$], phosphorus pentabromide ($PBr_5$), bromine ($Br_2$), phosphorus pentachloride ($PCl_5$), chlorine ($Cl_2$), hydrogen peroxide ($H_2O_2$), piranha solution, ozone ($O_3$), nickel(0) organometallic complexes, palladium(0) organometallic complexes, and platinum(0) organometallic complexes.

In an embodiment of the present invention, both the H-termination treatment and the nucleation promoting treatment are performed on the semiconductor body 30 prior to forming the nickel sulfide layer. In a particular embodiment, prior to forming the nickel sulfide layer the semiconductor body 30 is treated with HF acid to form H-terminated surfaces and also treated with the nucleation promoting substance, such as palladium(0) organometallic complexes, or platinum(0) organometallic complexes.

In one embodiment, a plasma treatment can also be performed on the semiconductor body 30 prior to forming the nickel sulfide layer. The plasma treatment is performed to improve the nucleation and surface adhesion of the nickel sulfide layer on the top surface 71 and the first and second sidewalls 72, 73 of the semiconductor body 30. In one embodiment, the plasma treatment uses a gas source, such as but not limited to helium, argon, xenon, oxygen, nitrogen, hydrogen, hydrogen bromide, chlorine, tetrafluoromethane, trifluoromethane, difluoromethane, octafluorocyclobutane, sulfur hexafluoride, hydrogen sulfide, ammonia or a combination of these gases. In one embodiment, the plasma treatment can be performed in combination with either the H-termination treatment or the nucleation promoting treatment prior to forming the nickel sulfide layer. In another embodiment, the plasma treatment can be performed with the combination of H-termination treatment and nucleation promoting treatment.

In one embodiment, the substrate 40 is placed in a reaction chamber to fabricate the nickel sulfide layer. The reaction chamber is maintained at a substantially constant pressure having a range of about 0.1 to 10.0 Torr during deposition of the nickel sulfide layer. Substrate 40 can be supported or secured on a support means in the reaction chamber. In one embodiment, the support means has the capability to heat the substrate 40 to a desired temperature. In an embodiment of the present invention, the substrate 40 is heated to a constant temperature having a range of about 25 to 450 degrees Celsius during deposition of the nickel sulfide layer, and ideally about 175 to 330 degrees Celsius.

Figure 3C:
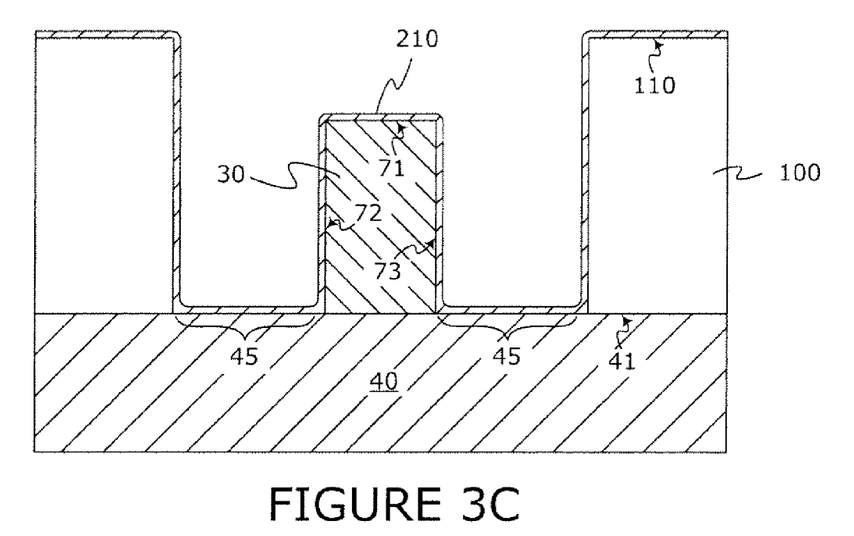

Next, a nickel sulfide layer is formed on the semiconductor body 30 as shown in FIG. 3C. Nickel sulfide layer is formed by an atomic layer deposition (ALD) process, wherein the substrate 40 is alternatingly exposed to a nickel-containing precursor and a sulfur-containing precursor. In one embodiment, the entire substrate 40 is alternatingly exposed to the nickel-containing precursor and the sulfur-containing precursor at a constant low temperature having a range of about 25 to 450 degrees Celsius.

In an embodiment of the present invention, the ALD process for fabricating the nickel sulfide layer begins by exposing the entire substrate 40, including the semiconductor body 30, to the nickel-containing precursor. In an embodiment of the present invention, the nickel-containing precursor is a nickel organometallic compound, such as but limited to amidinates, alkyls, allyls, β-diketonates, β-diketimines, pyrrolyls, imines, amides, alkoxides, cyclopentadienyls, halides, and heteroleptic compounds containing mixtures of the aforementioned ligands. In one embodiment, the nickel-containing precursor is a nickel(II) compound. In a particular embodiment, the nickel(II) compound is a bis(amidinate)nickel(II) complex having the chemical structure as shown in FIG. 7. In the chemical structure of the bis(amidinate)nickel(II) complex, the X-group is an alkyl group (—$C_xH_{2X+1}$). In one embodiment, the nickel-containing precursor is a bis(acetamidinate)nickel(II) complex also known as bis(N,N'-di-tert-butylacetamidinate)nickel(II), wherein the R and R' groups on the two nitrogen atoms in FIG. 7 are tertiary-butyl groups [—$C(CH_3)_3$] and the X-group is a methyl group (—$CH_3$). In another embodiment, the nickel-containing precursor is a bis(formamidinate)nickel(II) complex, wherein the R and R' groups on the two nitrogen atoms in FIG. 7 are tertiary-butyl groups [—$C(CH_3)_3$] and the X-group is a hydrogen (H) atom.

In one embodiment, the nickel-containing precursor is stored in a first source chamber, which is connected to the reaction chamber that houses the substrate 40. In one embodiment, the nickel-containing precursor is partially vaporized from the solid or liquid state in the first source chamber. Temperature of the first source chamber is maintained at a substantially constant temperature of about 25 to 150 degrees Celsius to ensure sufficient vapor pressure of the nickel-containing precursor. In the case where the nickel-containing precursor is a bis(N,N'-di-tert-butylacetamidinate)nickel(II), the temperature of the first source chamber is maintained at about 70 to 90 degrees Celsius. From the first source chamber, the nickel-containing precursor is delivered or released as a gas/vapor form into the reaction chamber in an amount sufficient to allow the nickel-containing precursor to react with the semiconductor body 30. In one embodiment, the substrate 40, including the semiconductor body 30, is exposed to the nickel-containing precursor for a time duration of about 0.5 to 10.0 seconds.

After exposing the substrate 40 to the nickel-containing precursor, a purging process can be performed to remove the nickel-containing precursor and other by-products from the substrate 40 before exposing the substrate 40 to the sulfur-containing precursor. In one embodiment, the purging process injects an inert gas, such as but not limited to nitrogen ($N_2$), helium (He) or argon (Ar), to remove any unreacted nickel-containing precursor and by-products from the reaction chamber. The purging process can be performed for a time duration of about 1.0 to 10.0 seconds.

Next, the substrate 40, including the semiconductor body 30, is exposed to the sulfur-containing precursor. The sulfur-containing precursor reacts with the reacted nickel-containing precursors deposited on the semiconductor body 30 to form a nickel sulfide layer 210. As shown in FIG. 3C, the nickel sulfide layer 210 deposited is conformal to the top surface 71 and the first and second sidewalls 72, 73 of the semiconductor body 30. In an embodiment of the present invention, the sulfur-containing precursor is hydrogen sulfide ($H_2S$). In other embodiments, the sulfur-containing precursor is a polysufane, alkyl sulfide or di-alkyl sulfide.

In one embodiment, the sulfur-containing precursor is stored in a second source chamber, which is connected to the reaction chamber that houses the substrate 40. In one embodiment, the sulfur-containing precursor is held in a gas/vapor form in the second source chamber. Temperature of the second source chamber is maintained at a substantially constant temperature of about to ensure sufficient vapor pressure of the sulfur-containing precursor. In the case where the sulfur-containing precursor is hydrogen sulfide, the second source chamber is maintained at ambient temperature of around 20 to 24 degrees Celsius. From the second source chamber, the sulfur-containing precursor is delivered or released as a gas/vapor form into the reaction chamber in an amount sufficient to react with the reacted nickel-containing precursors deposited on semiconductor body 30 so as to form a nickel sulfide layer 210. In one embodiment, the substrate 40, including the semiconductor body, is exposed to the sulfur-containing precursor for a time duration of about 0.1 to 10.0 seconds.

In an embodiment of the present invention, the substrate 40 is exposed to an optional plasma source during deposition of the sulfur-containing precursor. In other words, the substrate 40 is exposed to a plasma-enhanced deposition of the sulfur-containing precursor. The plasma source has the capability to remove any undesired residue from the substrate 40 to improve the nickel sulfide layer deposition. In one embodiment, the plasma source uses a gas source, such as but not limited to helium, argon, oxygen, nitrogen, hydrogen, ammonia or a combination of these gases.

After exposing the substrate 40 to the sulfur-containing precursor, a purging process can be performed to remove the sulfur-containing precursor and other by-products from the substrate 40 before exposing the substrate 40 to the nickel-containing precursor. In one embodiment, the purging process injects an inert gas, such as but not limited to nitrogen ($N_2$), helium (He) or argon (Ar), to remove any unreacted sulfur-containing precursor and by-products from the reaction chamber. The purging process can be performed for a time duration of about 1.0 to 10.0 seconds.

In one embodiment, a plasma treatment can be performed on the substrate 40 after purging the sulfur-containing precursor and before exposing to the nickel-containing precursor. The plasma treatment is performed to improve the surface adhesion and purity of the nickel sulfide layer 210 deposited prior to exposing the substrate 40 to the nickel-containing precursor. In one embodiment, the plasma treatment uses a gas source, such as but not limited to helium, argon, oxygen, nitrogen, hydrogen, ammonia or a combination of these gases.

Figure 3D:
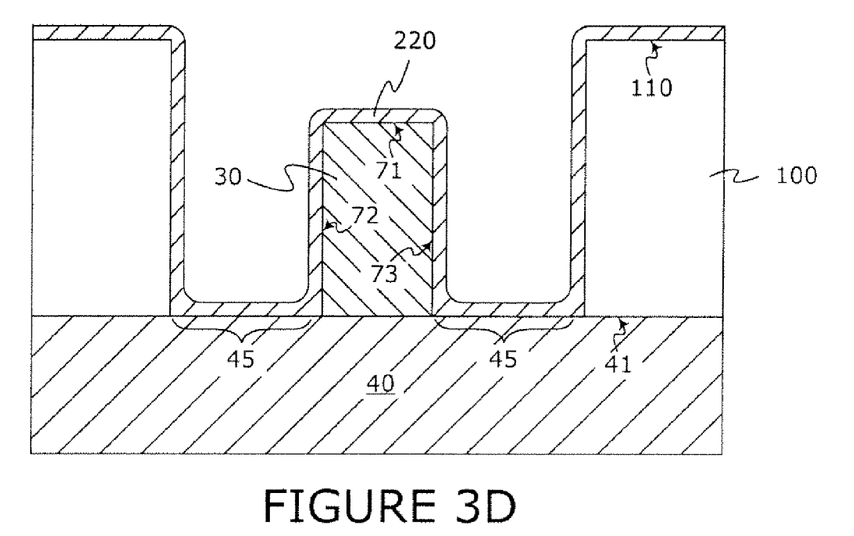

FIG. 3C illustrates one ALD cycle of forming the nickel sulfide layer 210 on the semiconductor body 30. Furthermore, the nickel sulfide layer 210 is also deposited onto the exposed regions 45 of the substrate and onto the interlayer dielectric 100. The ALD cycle can be repeated until a nickel sulfide layer of a desired thickness is formed on the semiconductor body 30. The semiconductor body is alternatingly exposed to the nickel-containing precursor and the sulfur-containing precursor to form nickel sulfide layer 220 as shown in FIG. 3D. In one embodiment, about 50 to 1000 ALD cycles are performed to fabricate the nickel sulfide layer 220 to a thickness of about 15 to 300 Angstroms on the semiconductor body 30. This completes the ALD process for forming the nickel sulfide layer 220 on the semiconductor body 30. In one embodiment, the nickel sulfide layer 220 serves as a contact layer for the source/drain region 31 of the semiconductor body 30.

In a particular embodiment, one ALD cycle comprises exposing the substrate 40 to a bis(N,N'-di-tert-butylacetamidinate)nickel(II) precursor for about 1.0 to 10.0 seconds, purging the bis(N,N'-di-tert-butylacetamidinate)nickel(II) precursor from the substrate 40 for about 1.0 to 10.0 seconds, exposing the substrate 40 to a hydrogen sulfide precursor for about 0.1 to 10.0 seconds, and purging the hydrogen sulfide precursor from the substrate for about 1.0 to 10.0 seconds. In this case, the thickness of the nickel sulfide layer 210 formed in one ALD cycle is about 0.3 Angstroms. Furthermore, around 1000 ALD cycles can be performed so that the nickel sulfide layer 220 deposited has a thickness of around 300 Angstroms and resistivity of around 120 μΩ.cm. During the ALD process, the temperature of the substrate 40 is maintained at around 175 to 330 degrees Celsius and pressure of the reaction chamber is maintained at around 0.1 to 10.0 Torr. In a specific embodiment, the nickel sulfide layer 220 deposited is a $Ni_2S$ layer having a composition that comprises about 62 to 66 atomic percent nickel, about 32 to 35 atomic percent sulfur, about 0 to 2 atomic percent carbon and about 0 to 0.5 atomic percent nitrogen as determined by X-ray photoelectron spectroscopy.

The nickel sulfide layer deposited by the ALD process exhibits high performance similar to conventional silicides with regard to the Schottky barrier height. For example, the nickel sulfide layer deposited on a p-type silicon substrate has a Schottky barrier height of about 0.56 to 0.63 eV. Furthermore, the nickel sulfide layer deposited on a n-type silicon substrate has a Schottky barrier height of about 0.48 to 0.55 eV.

Although the ALD process as described in relation to FIGS. 3B-3C begins by exposing semiconductor body 30 to the nickel-containing precursor first before exposing to the sulfur-containing precursor, it can be appreciated that the ALD process can also begin by exposing the semiconductor body 30 to the sulfur-containing precursor first before exposing to the nickel-containing precursor.

Furthermore, the ALD process as described in relation to FIGS. 3B-3C eliminates any semiconductor consumption due to the reaction between the nickel sulfide layer 220 and the semiconductor body 30. In other words, the ALD process eliminates the need for a reactive anneal commonly used in silicide formation, which usually results in detrimental semiconductor consumption. Semiconductor consumption is a particular concern for 3D semiconductor devices, which only have limited volume of semiconductor material in the active device region. Furthermore, the nickel sulfide layer 220, particularly the $Ni_2S$ layer, is a thermally stable material which does not react with semiconductor materials in the common processing temperature of up to 400 degrees Celsius.

Figure 3E:
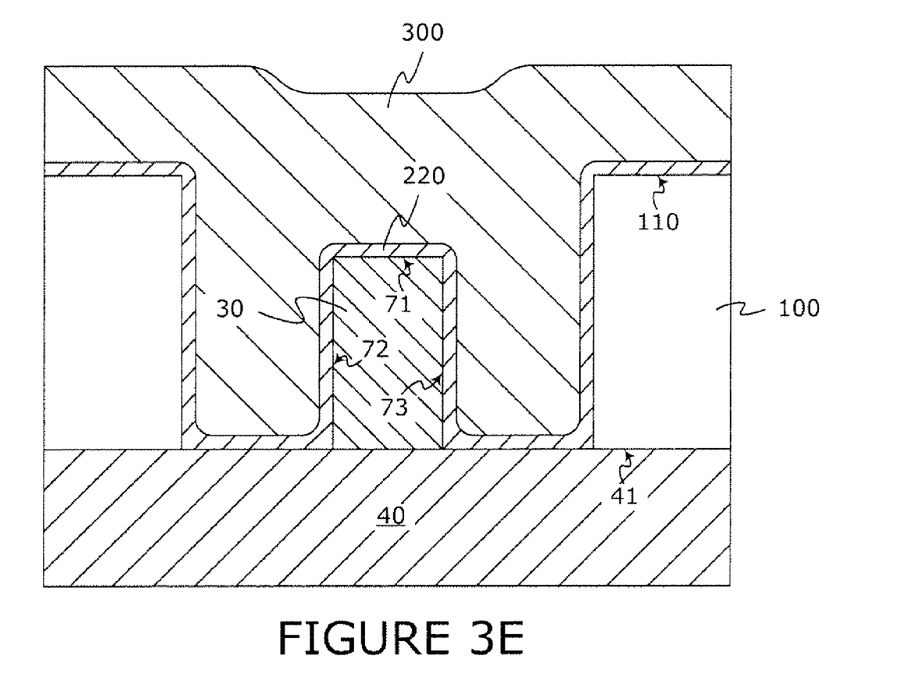

After the ALD process is complete, a metal layer can be formed onto the nickel sulfide layer 220. In one embodiment, the fabrication of the metal layer begins by blanket depositing a metal film 300 onto the entire nickel sulfide layer 220 as shown in FIG. 3E. The metal layer film 300 can be made of tungsten, titanium and other suitable metals. Metal film can be deposited by well known techniques, such as but not limited to chemical vapor deposition, physical vapor deposition and electroless deposition.

Figure 3F:
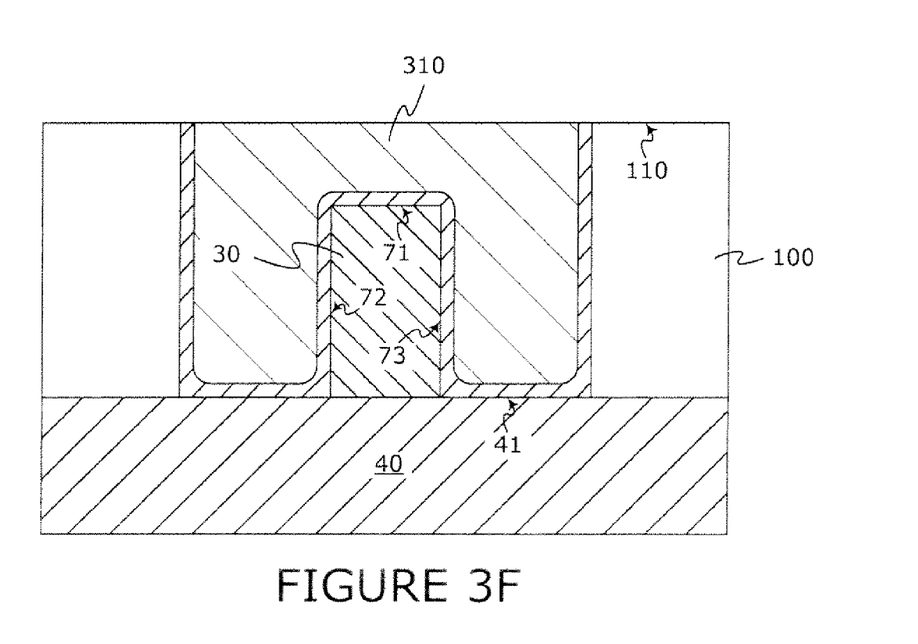

Next, in FIG. 3F, metal film 300 is planarize to form metal layer 310 having a top surface that is planar to the top surface 110 of the interlayer dielectric 100. The metal film 300 can be planarize by well known techniques, such as but not limited to chemical-mechanical polishing (CMP).

Figure 4A:
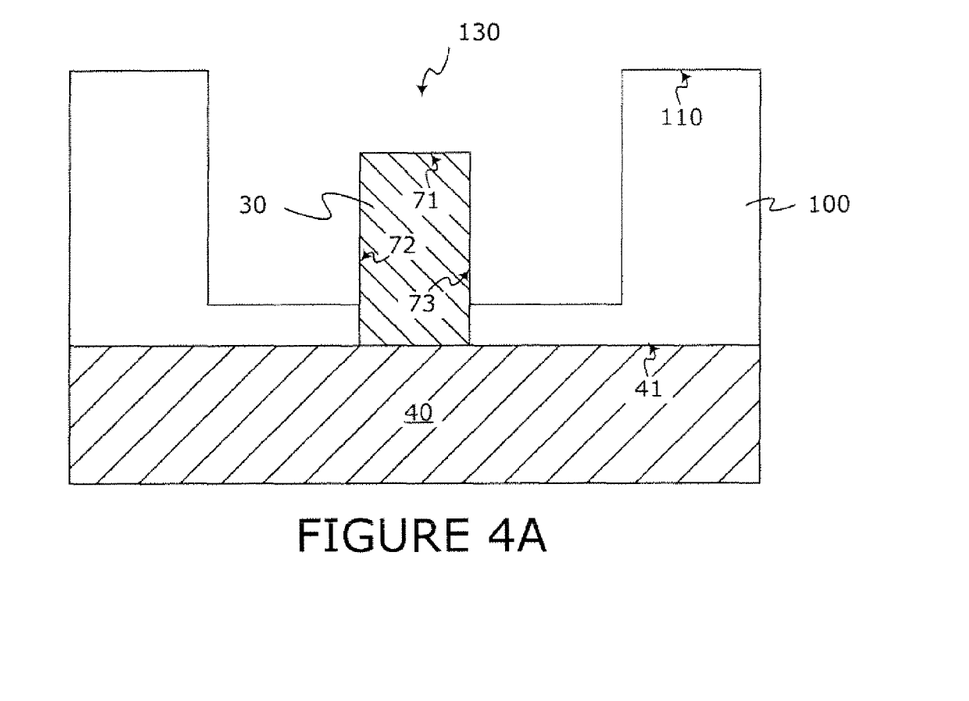
FIGS. 4A-4B are cross-sectional views that illustrate the method of forming a nickel sulfide layer on a semiconductor device in accordance with another embodiment of the present invention.

In an alternative embodiment of FIG. 3B, the interlayer dielectric 100 is patterned to form an opening 130 that partially exposes the semiconductor body 30 as shown in FIG. 4A. In contrast with FIG. 3B, the opening 130 does not expose portions of the substrate 40 adjacent to the semiconductor body. The opening 130 only exposes the top surface 71 and portions of the first and second sidewalls 72, 73. In one embodiment, the opening 130 exposes about two-third of the height of first and second sidewalk 72, 73.

Figure 4B:
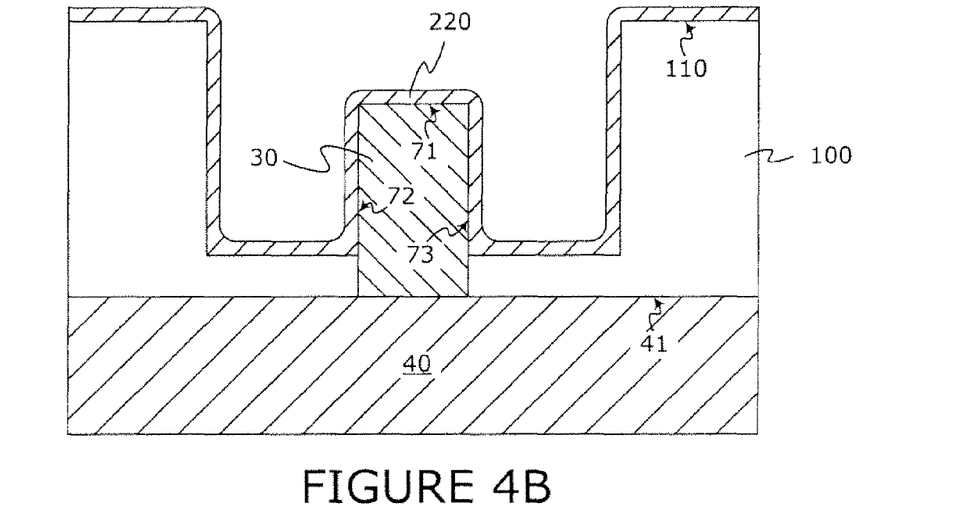

Next, in FIG. 4B, the ALD process similar to FIGS. 3C and 3D is performed to deposit the nickel sulfide layer 220 with a desired thickness on the top surface 71 and exposed portions of first and second sidewalls 72, 73. The nickel sulfide layer 220 is also deposited onto the entire interlayer dielectric 100. After depositing the nickel sulfide layer 220, a metal layer can be formed on the nickel sulfide layer 220 similar to the embodiments described in FIGS. 3E and 3F.

Figure 5A:
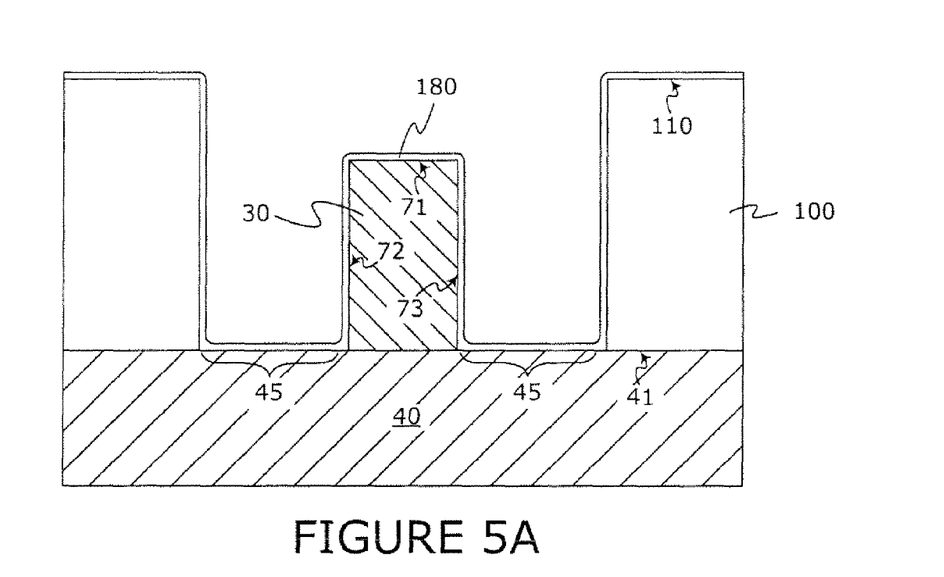
FIGS. 5A-5B are cross-sectional views that illustrate the method of forming a nickel sulfide layer on a semiconductor device in accordance with yet another embodiment of the present invention.

In another embodiment, the ALD process described in relation to FIGS. 3A-3F can be used to form a metal-insulator-semiconductor tunneling (MIST) contact layer. For example, after forming the opening 120 as described in FIG. 3A, a dielectric layer 180 is conformally deposited onto the semiconductor body 30 as shown in FIG. 5A. In this case, the dielectric layer 180 is also deposited onto the exposed portions 45 of the substrate 40 and the interlayer dielectric 100. In one embodiment, the dielectric layer 180 has a thickness of about 0.5 to 4.0 nanometers.

The dielectric layer 180 can be made of any suitable insulative material, such as but not limited to oxides, nitrides or oxynitrides (e.g. $SiO_2$, $Si_3N_4$, or SiON). In addition, the dielectric layer 180 can also be made of any suitable high-k dielectric material (i.e., k>4.0), such as but not limited to tantalum oxide ($Ta_2O_5$), titanium oxide ($TiO_2$) and hafnium oxide ($HfO_2$). The dielectric layer 180 is conformally deposited on the semiconductor body using well known techniques, such as but not limited to CVD or ALD. In the case where the dielectric layer 180 is made of oxides, nitrides or oxynitrides, the dielectric layer 180 can be thermally grown or formed by a surface plasma treatment.

Figure 5B:
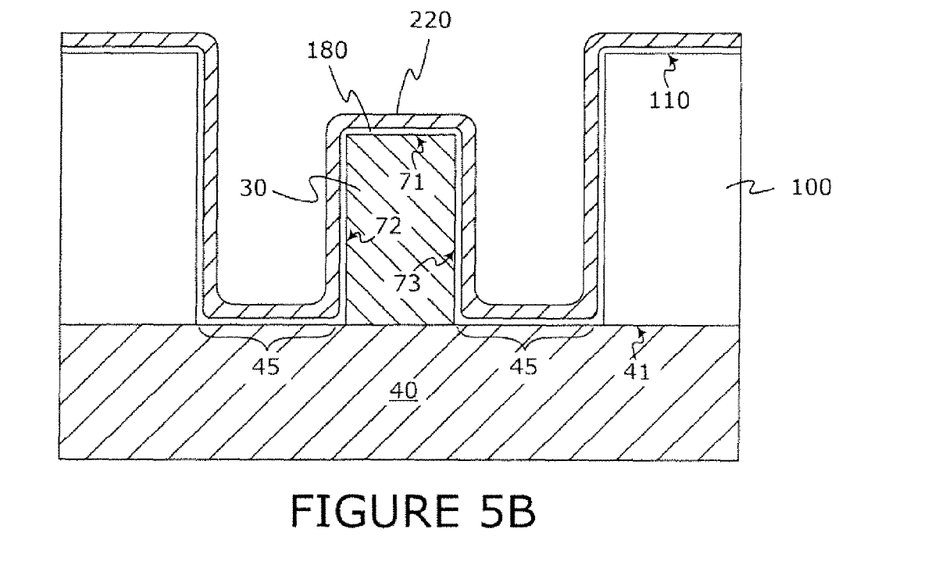

Next, in FIG. 5B, an ALD process is performed to conformally deposit the nickel sulfide layer 220 onto the dielectric layer 180. The ALD process used for forming the nickel sulfide layer 220 is similar to the process described in relation to FIGS. 3C and 3D and thus will not be described in detail here. After depositing the nickel sulfide layer 220, no reactive annealing is performed for the nickel sulfide layer 220 to react with the dielectric layer 180. In other words, the nickel sulfide layer 220 and dielectric layer 180 remains as discrete or separate layers. Subsequently, a metal layer can be formed on the nickel sulfide layer 220 similar to the embodiments described in FIGS. 3E and 3F.

It can be contemplated that the MIST contact layer can also be formed onto the partially exposed semiconductor 30 previously described in FIGS. 4A and 4B. For example, after forming the opening 130 shown in FIG. 4A, a dielectric layer can be conformally deposited onto the semiconductor body 30 according to the methods described in FIG. 5A. Then, the ALD process similarly described in FIGS. 3C and 3D is performed on the substrate 30 to form the nickel sulfide layer 220 onto the dielectric layer.

Although the ALD process describes the formation of a nickel sulfide contact layer for a tri-gate transistor in FIGS. 3A-3F, it can be appreciated that the ALD process is not limited so such an application and device but can also be applied in other devices, such as but not limited to bipolar junction transistors (BJTs) and planar metal-oxide-semiconductor field effect transistors (MOSFETs).

Figure 6A:
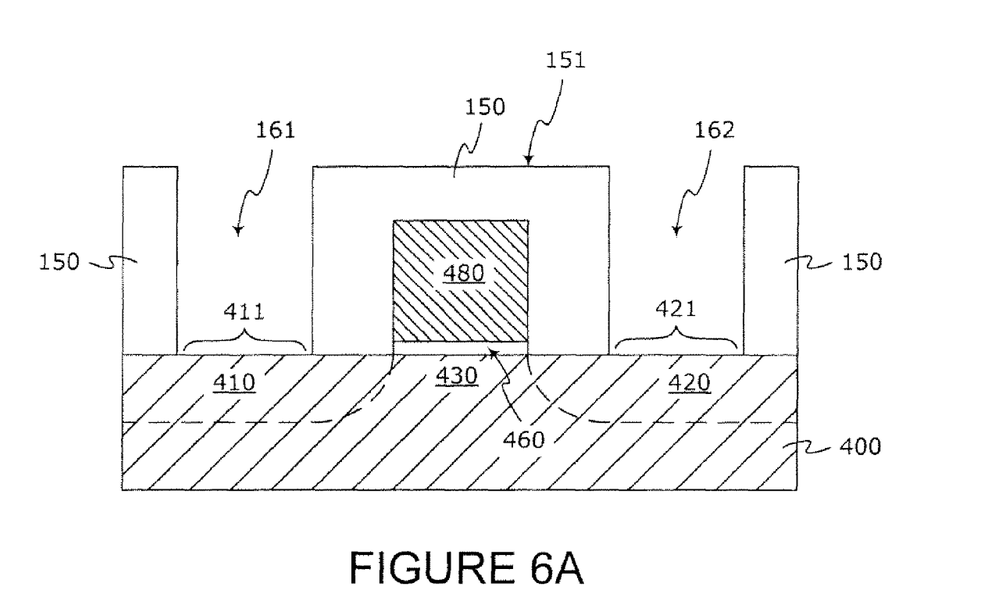
FIGS. 6A-6D are cross-sectional views that illustrate the method of forming a nickel sulfide layer on the source and drain regions of a planar MOSFET in accordance with one embodiment of the present invention.

In an embodiment of the present invention, nickel sulfide layers can be formed on a planar MOSFET. FIGS. 6A-6D illustrate a method of forming nickel sulfide contact layers on a planar MOSFET in accordance with one embodiment of the present invention. Referring to FIG. 6A, the MOSFET comprises a substrate 400 having a gate dielectric 460 formed thereon, and a gate electrode 480 is formed on the gate dielectric 460. The substrate 400 is made from materials similar to the substrate 40 as described in relation to FIG. 3A, and thus will not be discussed in detail here.

Gate dielectric 460 is formed from any suitable insulative material used for insulating the substrate 400 from the gate electrode 480. In one embodiment, the gate dielectric layer 440 is made of a material such as but not limited to silicon oxide (e.g., $SiO_2$). In another embodiment, the gate dielectric layer 440 is made of a high k dielectric material (i.e., k>4.0), such as but not limited to tantalum oxide ($Ta_2O_5$), titanium oxide (TiO$_2$) and hafnium oxide (HfO$_2$). Gate electrode 480 can be made of polysilicon or metal.

The substrate 400 includes a source region 410 and a drain region 420, wherein the source and drain regions 410, 420 are formed on opposite sides of the gate electrode 480. The portion of the substrate 400 located between the source and drain regions 410, 420 and underneath the gate electrode 460 refers to the channel region 430.

Next, an interlayer dielectric 150 is deposited onto the entire substrate 400, including the gate electrode 480. Then, a first opening 161 and a second opening 162 are formed to expose region 411 of source region 410 and expose region 421 of drain region 420. The first and second openings 161, 162 can also be referred to as contact holes 161, 162, which expose the source and drain regions 410, 420. In one embodiment, the contact holes 161, 162 have a high aspect ratio (>5:1), where the height of each contact hole is at least five times larger than the width of the contact hole. The methods of forming the interlayer dielectric 150 and the openings 161, 162 are similar to the methods of forming interlayer dielectric 100 in FIG. 3A and the opening 120 in FIG. 3B. Hence, the formation of the interlayer dielectric 150 and the openings 161, 162 will not be discussed in detail here.

Next, a nickel sulfide layer is formed on the substrate 400. The nickel sulfide layer is formed by using similar ALD process described in relation to FIG. 3C. Before exposing the substrate 400 to the nickel-containing or sulfur-containing precursors, the substrate 400, in particular the exposed regions 411, 421, can be exposed to a H-termination treatment, a nucleation promoting treatment, a plasma treatment or any combinations of these treatments as previously described in FIG. 3B.

Figure 6B:
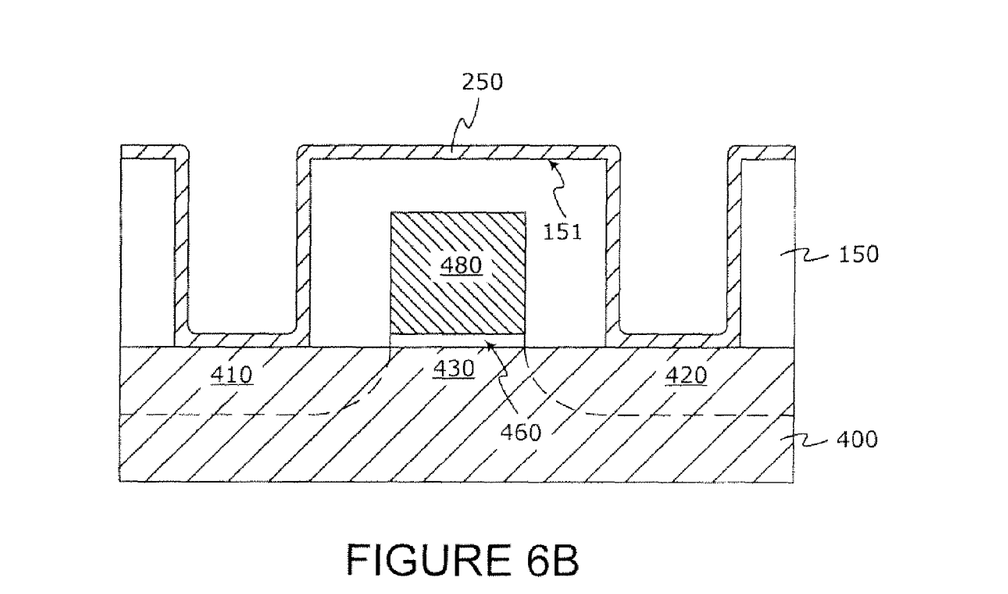

Briefly, the substrate 400 is alternatingly exposed to a nickel-containing precursor sulfur-containing precursor to form a nickel sulfide layer 250 on the exposed regions 421, 422 of the substrate. Furthermore, the nickel sulfide layer 250 is also deposited onto the interlayer dielectric 150. As shown in FIG. 6B, the nickel sulfide layer 250 is deposited conformal to the exposed regions 421, 422 as well as the interlayer dielectric 150. FIG. 6B represents one ALD cycle, which comprises the similar ALD process conditions as described in relation to FIG. 3C, and thus not discussed in detail here.

Figure 6C:
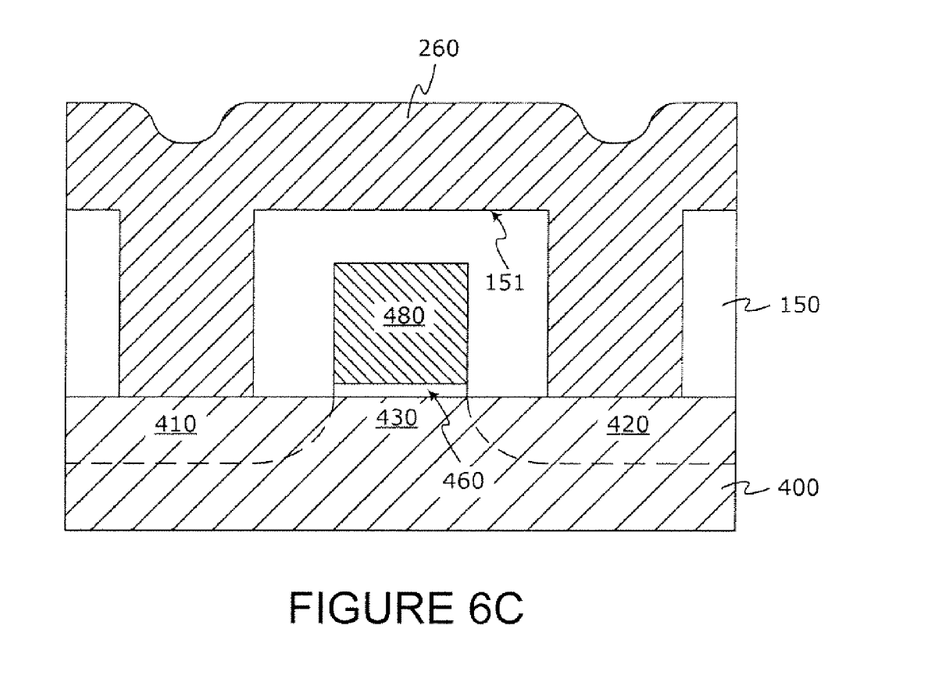

Subsequently, the ALD cycle is repeated to form a nickel sulfide layer 260 that fills up the entire contact holes 161, 162 and is also deposited onto the top surface 151 of interlayer dielectric 150. As shown in FIG. 6C, the nickel sulfide layer 260 fills up the contact holes 161, 162 without any cavities. Typically, the non-conformal nature of conventional PVD metal deposition may result in an "edging" effect at the top of the contact holes, which may result in the subsequent formation of undesirable cavities in the metal deposited in the contact holes. The ALD process described in FIGS. 6B and 6C conformally deposits nickel sulfide layers onto the profile of the contact holes 161, 162, which prevents the formation of cavities in the nickel sulfide layer 260 deposited in contact holes 161, 162.

Figure 6D:
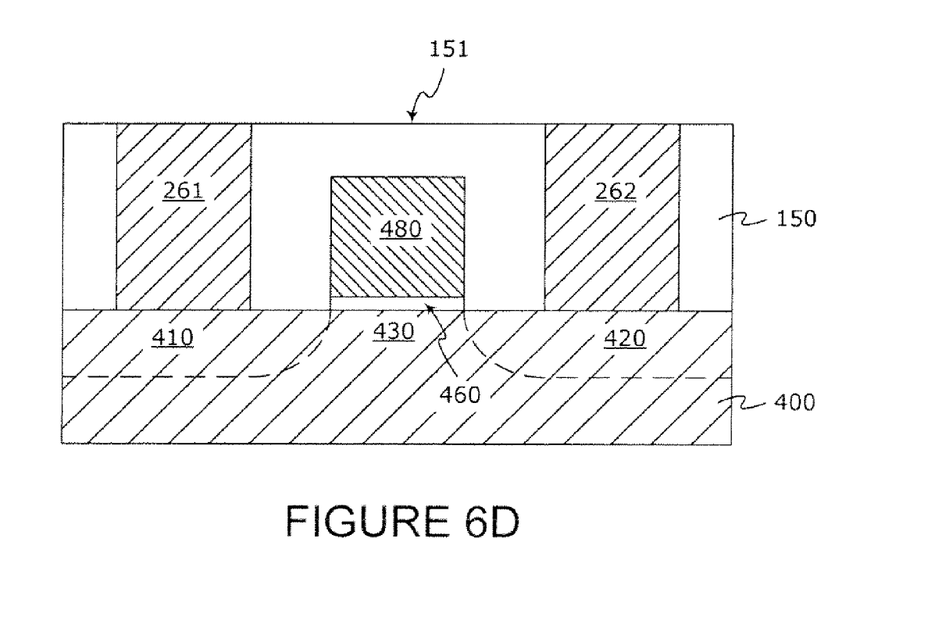

Next, in FIG. 6D, the nickel sulfide layer 260 is planarize to the top surface 151 of the interlayer dielectric 150, which leaves a nickel sulfide contact 261 in the contact hole 161 and a nickel sulfide contact 262 in the contact hole 162. The top surfaces of both nickel sulfide contacts 261, 262 are planar to the top surface 151 of the interlayer dielectric 150. The nickel sulfide layer 260 can be planarize by well known techniques, such as but not limited to chemical-mechanical polishing (CMP).

In an alternative embodiment, a different metal layer can be deposited into the contact holes 161, 162 with the nickel sulfide layer 260. For example, the ALD cycle described in FIG. 6B can be repeated to form a conformal nickel sulfide layer 260 to a desired thickness, for example 15 to 300 Angstroms. Then, a metal layer is formed onto the nickel sulfide layer 260 using similar process as described in FIGS. 3E and 3F. Briefly, a metal layer, such as tungsten or titanium, is blanket deposited onto the nickel sulfide layer 260 followed by a CMP process to planarize the top surface of metal layer to the top surface 151 of interlayer dielectric 150.

In other embodiments, the ALD process can be used to form MIST contacts similar to FIGS. 5A-5B on the source/drain regions of planar MOSFET shown in FIGS. 6A-6D. For example, a dielectric layer is conformally deposited onto the exposed regions 421, 422 of source/drain regions 410/420 before performing the ALD process to form the nickel sulfide layer on the dielectric layer. It can be contemplated that the MIST contact can be formed on the source region 410 while a conventional silicide contact is formed on the drain region 420 and vice versa. With regard to a CMOS device having a PMOS device and a NMOS device, the PMOS device can be formed with MIST contact while the NMOS device is formed with conventional silicide contact and vice versa.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. A semiconductor device, comprising:
a substrate having a gate electrode formed thereon;
a source region and a drain region formed in the substrate, wherein the source and drain regions are formed on opposite sides of the gate electrode;
an interlayer dielectric formed on the substrate and the source and drain regions, the interlayer dielectric having
a first opening extending from the top surface of the interlayer dielectric to the source region; and
a second opening extending from the top surface of the interlayer dielectric to the drain region;
a first nickel sulfide contact layer formed on the source region in the first opening; and
a second nickel sulfide contact layer formed on the drain region in the second opening.

2. The semiconductor of claim 1,
wherein the first nickel sulfide contact layer is conformally deposited in the first opening; and
wherein the second nickel sulfide contact layer is conformally deposited in the second opening.

3. The semiconductor device of claim 1, wherein the first and second nickel sulfide contact layers have a composition comprising about 62 to 66 atomic percent nickel, and about 32 to 35 atomic percent sulfur.

* * * * *